(12) United States Patent
Yanagisawa et al.

(10) Patent No.: US 11,462,407 B2
(45) Date of Patent: Oct. 4, 2022

(54) ETCHING METHOD AND ETCHING APPARATUS

(71) Applicant: TOKYO ELECTRON LIMITED, Tokyo (JP)

(72) Inventors: Yusuke Yanagisawa, Miyagi (JP); Yusuke Takino, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/979,063

(22) PCT Filed: Jul. 9, 2019

(86) PCT No.: PCT/JP2019/027078
§ 371 (c)(1),
(2) Date: Sep. 8, 2020

(87) PCT Pub. No.: WO2020/022045
PCT Pub. Date: Jan. 30, 2020

(65) Prior Publication Data
US 2021/0057220 A1  Feb. 25, 2021

(30) Foreign Application Priority Data
Jul. 23, 2018  (JP) .............................. JP2018-137841

(51) Int. Cl.
*H01L 21/033* (2006.01)
*H01L 21/67* (2006.01)
(Continued)

(52) U.S. Cl.
CPC .... *H01L 21/0337* (2013.01); *H01L 21/67069* (2013.01); *H01L 21/31144* (2013.01); *H01L 21/32139* (2013.01)

(58) Field of Classification Search
None
See application file for complete search history.

(56) References Cited

U.S. PATENT DOCUMENTS

| 8,431,461 | B1 * | 4/2013 | Zhong | ..................... H01L 29/78 438/303 |
| 2003/0040196 | A1 * | 2/2003 | Lim | ................... H01L 21/02192 438/785 |

(Continued)

FOREIGN PATENT DOCUMENTS

| JP | 2009-099938 A | 5/2009 |
| JP | 2009-130035 A | 6/2009 |

(Continued)

OTHER PUBLICATIONS

International Search Report dated Sep. 17, 2019 for WO 2020/022045 A1, 4 pages.

*Primary Examiner* — Roberts P Culbert
(74) *Attorney, Agent, or Firm* — Weihrouch IP

(57) ABSTRACT

An etching method includes: forming a second film on a workpiece target including a processing target film, a layer including a plurality of convex portions formed on the processing target film, and a first film that covers the plurality of convex portions and the processing target film exposed between the plurality of convex portions; etching the second film in a state where the second film remains on a portion of the first film that covers a side surface of each of the plurality of convex portions; and etching the first film in a state where the second film remains on the portion of the first film that covers the side surface of each of the plurality of convex portions, thereby exposing a top portion of each of the plurality of convex portions and the processing target film between the plurality of convex portions.

14 Claims, 10 Drawing Sheets

(51) Int. Cl.
*H01L 21/311* (2006.01)
*H01L 21/3213* (2006.01)

(56) References Cited

U.S. PATENT DOCUMENTS

| | | | | |
|---|---|---|---|---|
| 2009/0130851 A1* | 5/2009 | Hasegawa | ......... | H01L 21/31144 |
| | | | | 438/694 |
| 2009/0163030 A1* | 6/2009 | Omura | ................ | H01L 21/0337 |
| | | | | 438/703 |
| 2014/0308815 A1* | 10/2014 | Dokan | ................ | H01L 21/0206 |
| | | | | 438/714 |
| 2015/0287612 A1* | 10/2015 | Luere | ................. | H01L 21/3086 |
| | | | | 438/703 |

FOREIGN PATENT DOCUMENTS

| | | |
|---|---|---|
| JP | 2009-152243 A | 7/2009 |
| JP | 2012-178378 A | 9/2012 |
| WO | 2010/134176 A1 | 11/2010 |

\* cited by examiner

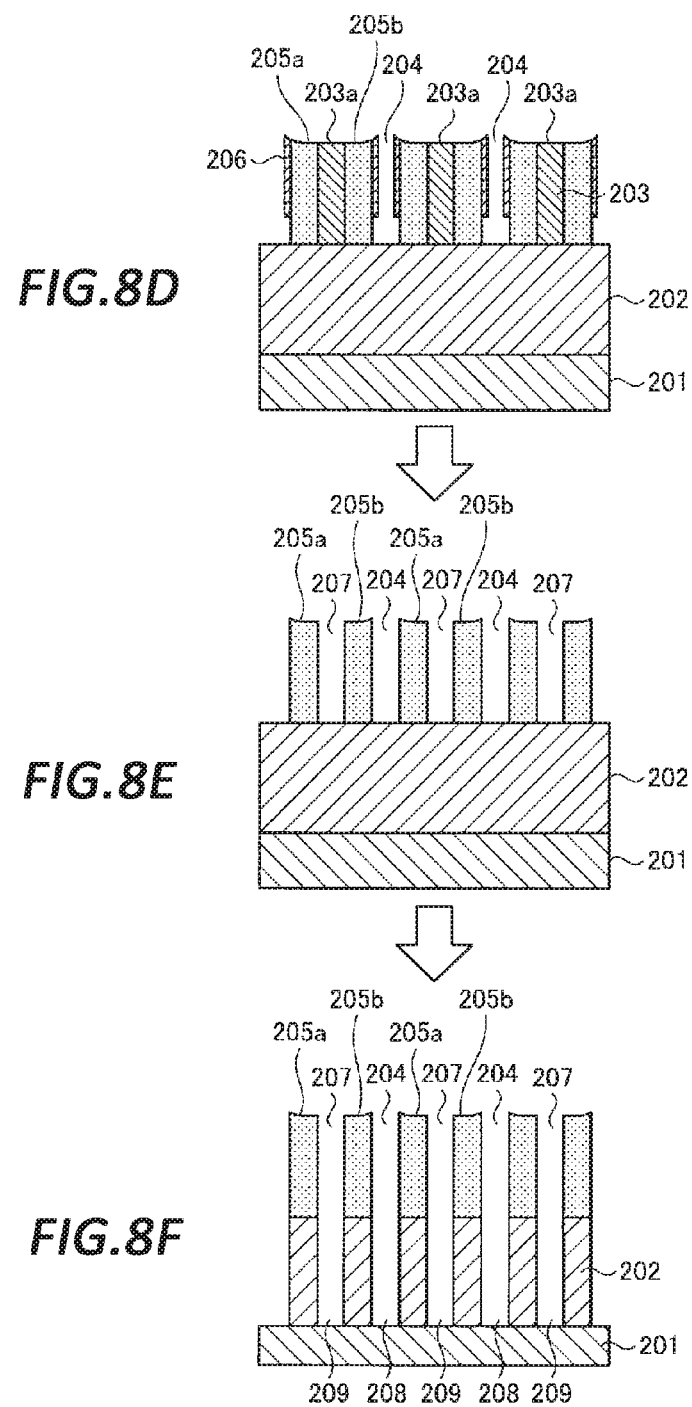

AFTER ETCHING LINER FILM

AFTER ETCHING SPACER FILM

ETCHING METHOD AND ETCHING APPARATUS

CROSS REFERENCE TO RELATED APPLICATIONS

This application is a national phase of PCT application No. PCT/JP2019/027078, filed on 9 Jul. 2019, which claims priority from Japanese Patent Application No. 2018-137841, filed on 23 Jul. 2018, all of which are incorporated herein by reference, and priority is claimed to each of the foregoing.

TECHNICAL FIELD

The present disclosure relates to an etching method and an etching apparatus.

BACKGROUND

In the related art, a self-aligned multi patterning (SAMP) is known as a patterning technology using an etching process. In the SAMP, for example, a wafer including a processing target film, a mandrel layer including a plurality of convex portions formed on the processing target film, and a spacer film that covers the convex portions and the film exposed between the convex portions convex portions, is used. In the SAMP, first, the etching process is performed on the spacer film to expose the convex portions of the mandrel layer and the processing target film between the convex portions. Subsequently, in the SAMP, the exposed convex portions of the mandrel layer are selectively removed. Thereafter, in the SAMP, the processing target film is etched using the remaining spacer film as a mask.

PRIOR ART DOCUMENT

Patent Document

Patent Document 1: Japanese Patent Laid-Open Publication No. 2009-099938
Patent Document 2: Japanese Patent Laid-Open Publication No. 2012-178378

SUMMARY OF THE INVENTION

Problems to be Solved

The present disclosure provides a technology capable of improving a shape of the shoulder of a mask.

Means to Solve the Problems

An etching method according to an aspect of the present disclosure includes: a film forming process of forming a second film on a workpiece including a processing target film, a layer including a plurality of convex portions formed on the processing target film, and a first film that covers the plurality of convex portions and the processing target film exposed between the plurality of convex portions; a first etching process of etching the second film in a state where the second film remains on a portion of the first film that covers a side surface of each of the plurality of convex portions; and a second etching process of etching the first film in a state where the second film remains on the portion of the first film that covers the side surface of each of the convex portions, thereby exposing a top portion of each of the convex portions and the processing target film between the plurality of convex portions.

Effect of the Invention

According to the present disclosure, it is possible to improve the shape of the shoulder of the mask.

BRIEF DESCRIPTION OF THE DRAWINGS

FIGS. 8A to 8F are views for explaining an example of flow of processing of an etching method according to an embodiment.

DETAILED DESCRIPTION TO EXECUTE THE INVENTION

Hereinafter, various exemplary embodiments will be described in detail with reference to the drawings. Meanwhile, in the respective drawings, the same or corresponding parts will be denoted by the same symbols.

In the related art, a self-aligned multi patterning (SAMP) is known as a patterning technology using an etching process. In the SAMP, for example, a wafer including a processing target film, a mandrel layer including a plurality of convex portions formed on the processing target film, and a spacer film that covers the convex portions and the film exposed between convex portionsonvex portions, is used. In the SAMP, first, the etching process is performed on the spacer film to expose the convex portions of the mandrel layer and the processing target film between convex portions. Subsequently, in the SAMP, the exposed convex portions of the mandrel layer are selectively removed. Thereafter, in the SAMP, the processing target film is etched using the remaining spacer film as a mask.

However, the technology described above has a problem that, when the spacer film is etched to expose the convex portions of the mandrel layer and the processing target film, there is a problem in that the shoulder of the remaining spacer film is etched and rounded.

That is, at the stage in which the spacer film is etched and the convex portions of the mandrel layer and the processing target film are exposed, the convex portions of the mandrel layer with the top exposed remains on the processing target film, and the spacer film remains on both sides of each of the convex portions of the mandrel layer. Here, the shoulders of the upper portion of the spacer film on both sides with a convex portion of the mandrel layer interposed therebetween, may be rounded. As a result, for example, the thickness of the mask in the vertical direction with respect to the processing target film in the shoulder of the spacer film may be thinned, which may impair functions such as selectivity as a mask in the subsequent etching. Further, in the SAMP, the spacer film remaining after the exposed convex portions of the mandrel layer are selectively removed is not symmetrical and does not have a vertical rectangular shape, and thus, a uniform etching shape may not be obtained in the subsequent etching.

[Configuration of Etching Apparatus 10]

Figure 1:
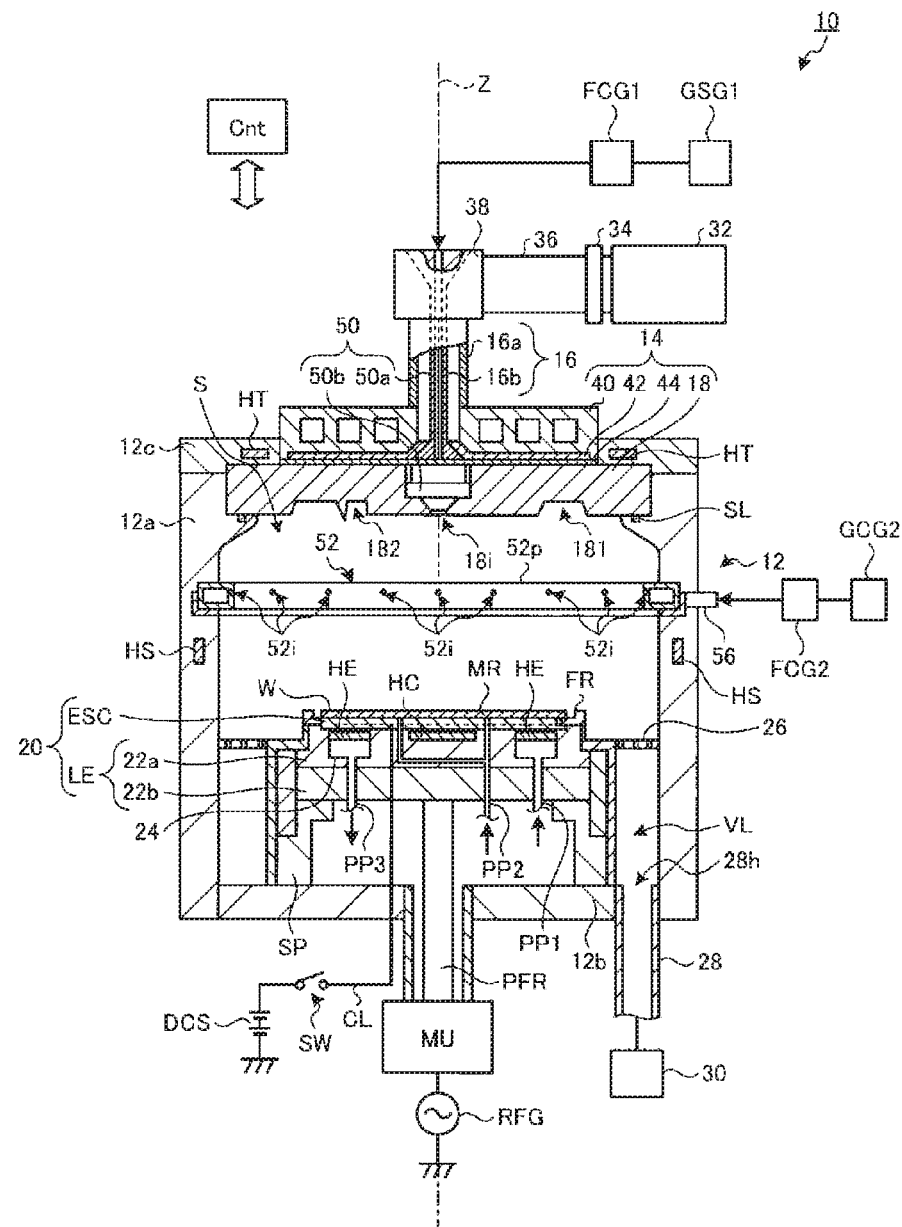
FIG. 1 is a cross-sectional view illustrating an example of a schematic etching apparatus according to an embodiment.

FIG. 1 is a cross-sectional view illustrating an example of a schematic etching apparatus 10 according to an embodiment. For example, as illustrated in FIG. 1, the etching apparatus 10 includes a chamber 12. The chamber 12 provides a processing space S where a wafer W, which is an example of a workpiece, is accommodated. The chamber 12 includes a side wall 12a, a bottom 12b, and a ceiling 12c. The side wall 12a has a substantially cylindrical shape having the Z axis as an axis. For example, the Z axis passes through the center of a stage (to be described later) in the vertical direction.

The bottom 12b is provided at a lower end side of the side wall 12a. Further, the upper end portion of the side wall 12a is opened. The opening of the upper end portion of the side wall 12a is closed by a dielectric window 18. The dielectric window 18 is sandwiched between the upper end portion of the side wall 12a and the ceiling 12c. A sealing member SL may be interposed between the dielectric window 18 and the upper end portion of the side wall 12a. The sealing member SL is, for example, an O-ring, and contributes to sealing of the chamber 12.

In the chamber 12, a stage 20 is provided below the dielectric window 18. The stage 20 includes a lower electrode LE and an electrostatic chuck ESC. The lower electrode LE includes a first plate 22a and a second plate 22b, for example, made of aluminum and having a substantially disc shape. The second plate 22b is supported by a tubular support SP. The support SP extends vertically upwardly from the bottom 12b. The first plate 22a is provided on the second plate 22b, and electrically connected with the second plate 22b.

The lower electrode LE is electrically connected to a radio-frequency power source RFG via a power feeding rod PFR and a matching unit MU. The radio-frequency power source RFG supplies a radio-frequency bias to the lower electrode LE. The frequency of the radio-frequency bias generated by the radio-frequency power source RFG is a predetermined frequency suitable for controlling the energy of ions attracted to the wafer W, for example, 13.56 MHz. The matching unit MU accommodates a matcher for matching between the impedance of the radio-frequency power source RFG side and the impedance of the load side such as, mainly, the electrode, the plasma, and the chamber 12. For example, a blocking capacitor for self-bias generation is included in the matcher.

The electrostatic chuck ESC is provided on the first plate 22a. The electrostatic chuck ESC includes a mounting region MR for mounting the wafer W on the processing space S side. The mounting region MR is a substantially circular region substantially perpendicular to the Z axis, and has a diameter substantially equal to the diameter of the wafer W or a diameter slightly smaller than the diameter of the wafer W. Further, the mounting region MR constitutes the upper surface of the stage 20, and the center of the mounting region MR, that is, the center of the stage 20 is positioned on the Z axis.

The electrostatic chuck ESC holds the wafer W by an electrostatic attraction force. The electrostatic chuck ESC includes an attracting electrode provided in the dielectric. The attracting electrode of the electrostatic chuck ESC is electrically connected with a DC power source DCS via a switch SW and a covered wire CL. The electrostatic chuck ESC attracts and holds the wafer W on the upper surface of the electrostatic chuck ESC by the Coulomb force generated by the DC voltage applied from the DC power source DCS. A focus ring FR is provided radially outside the electrostatic chuck ESC to annularly surround the periphery of the wafer W.

An annular flow path 24 is formed inside the first plate 22a. The flow path 24 is supplied with a coolant from a chiller unit through a pipe PP1. The coolant supplied to the flow path 24 returns to the chiller unit through a pipe PP3. Further, in the etching apparatus 10, a heat transfer gas from a heat transfer gas supply unit, for example, He gas is supplied between the top surface of the electrostatic chuck ESC and the rear surface of the wafer W through a supply pipe PP2.

A space is formed outside the outer periphery of the stage 20, that is, between the stage 20 and the side wall 12a, and the space serves as an exhaust path VL having an annular shape in plan view. An annular baffle plate 26 formed with a plurality of through-holes is provided between the exhaust path VL and the processing space S. The exhaust path VL is connected to an exhaust pipe 28 via an exhaust port 28h. The exhaust pipe 28 is attached to the bottom 12b of the chamber 12. An exhaust device 30 is connected to the exhaust pipe 28. The exhaust device 30 includes a vacuum pump such as a pressure adjuster and a turbo molecular pump. The processing space S in the chamber 12 may be decompressed to a desired vacuum degree by the exhaust device 30. Further, the gas supplied to the wafer W flows toward the outside of the edge of the wafer W along the surface of the wafer by the exhaust device 30, and is exhausted from the outer periphery of the stage 20 through the exhaust path VL.

Further, the etching apparatus 10 of the embodiment includes heaters HT, HS, HC, and HE as temperature control mechanisms. The heater HT is provided in the ceiling 12c, and extends annularly to surround an antenna 14. The heater HS is provided in the side wall 12a, and extends annularly. The heater HC is provided in the first plate 22a or in the electrostatic chuck ESC. The heater HC is provided below the central portion of the mounting region MR described above, that is, in a region intersecting with the Z axis. The heater HE annularly extends to surround the heater HC. The heater HE is provided below the outer edge portion of the mounting region MR described above.

Further, the etching apparatus 10 includes the antenna 14, a coaxial waveguide 16, a microwave generator 32, a tuner 34, a waveguide 36, and a mode converter 38. The antenna 14, the coaxial waveguide 16, the microwave generator 32, the tuner 34, the waveguide 36, and the mode converter 38 constitute a plasma generating unit configured to excite the gas supplied into the chamber 12.

The microwave generator 32 generates a microwave having a frequency of, for example, 2.45 GHz. The microwave generator 32 is connected to the upper portion of the coaxial waveguide 16 via the tuner 34, the waveguide 36, and the mode converter 38. The coaxial waveguide 16 extends along the Z axis which is a central axis thereof.

The coaxial waveguide 16 includes an outer conductor 16a and an inner conductor 16b. The outer conductor 16a has a cylindrical shape extending around the Z axis. The lower end of the outer conductor 16a is electrically connected to the upper portion of the cooling jacket 40 having a conductive surface. The inner conductor 16b has a cylindrical shape extending around the Z axis, and is provided coaxially with the outer conductor 16a inside the outer conductor 16a. The lower end of the inner conductor 16b is connected to a slot plate 44 of the antenna 14.

In the embodiment, the antenna 14 is a radial line slot antenna (RLSA). The antenna 14 is disposed within an opening formed in the ceiling 12c so as to face the stage 20. The antenna 14 includes a cooling jacket 40, a dielectric plate 42, the slot plate 44, and the dielectric window 18. The dielectric window 18 is an example of an upper ceiling plate. The dielectric plate 42 has a substantially disc shape, and shorten the wavelength of the microwave. The dielectric plate 42 is made of, for example, quartz or alumina, and is sandwiched between the slot plate 44 and the lower surface of the cooling jacket 40.

Figure 2:
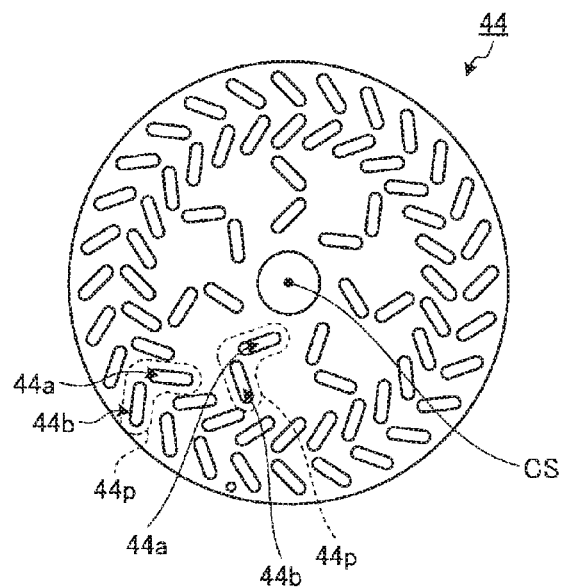
FIG. 2 is a plan view illustrating an example of a slot plate.

FIG. 2 is a plan view illustrating an example of the slot plate 44. The slot plate 44 has a thin-plate shape and a disc shape. Both sides of the slot plate 44 in the plate thickness direction are flat, respectively. A center CS of the slot plate 44 is positioned on the Z axis. A plurality of slot pairs 44p is provided in the slot plate 44. Each of the plurality of slot pairs 44p includes two slot holes 44a and 44b penetrating in the plate thickness direction. The planar shape of each of the slot holes 44a and 44b is, for example, an elongated circle shape. In each slot pair 44p, an extending direction of the major axis of the slot hole 44a and an extending direction of the major axis of the slot hole 44b intersect with each other or are perpendicular to each other. The plurality of slot pairs 44p are arranged around the center CS so as to surround the center CS of the slot plate 44. In the example illustrated in FIG. 2, the plurality of slot pairs 44p are arranged along two concentric circles. The slot pairs 44p are substantially equidistantly arranged on each concentric circle. The slot plate 44 is provided on an upper surface 18u on the dielectric window 18 (see, FIG. 4).

Figure 3:
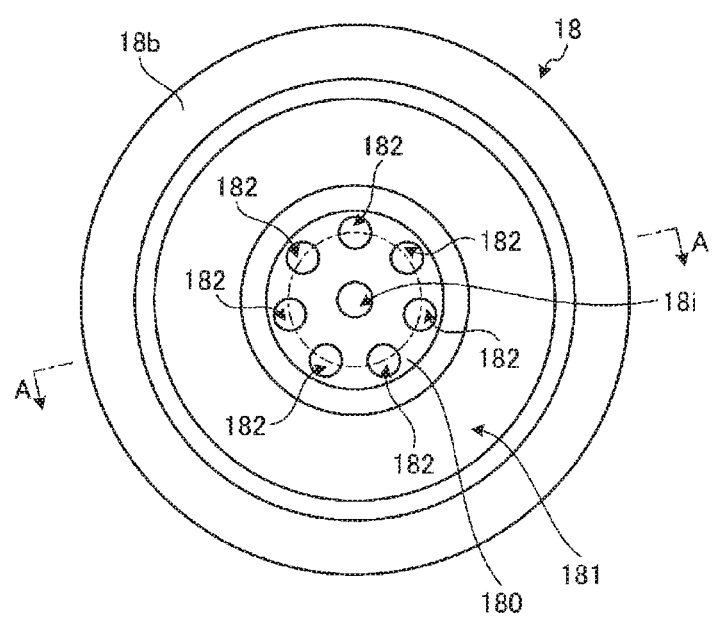
FIG. 3 is a plan view illustrating an example of a dielectric window.
Figure 4:
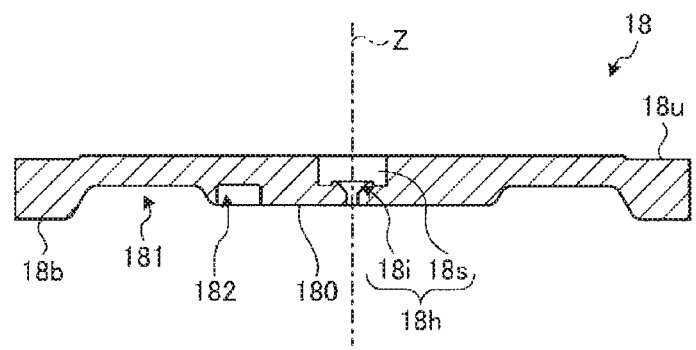
FIG. 4 is a cross-sectional view taken along the line A-A in FIG. 3.

FIG. 3 is a plan view illustrating an example of the dielectric window 18, and FIG. 4 is a cross-sectional view along taken the line A-A in FIG. 3. For example, as illustrated in FIGS. 3 and 4, the dielectric window 18 is formed in a substantially disc shape by a dielectric such as quartz. A through-hole 18h is formed in the center of the dielectric window 18. The upper side portion of the through-hole 18h is a space 18s in which an injector 50b of a central introduction unit 50 (to be described) is accommodated, and the lower portion is a gas ejection port 18i of the central introduction unit 50 (to be described). In the embodiment, the central axis of the dielectric window 18 substantially coincides with the Z axis.

A surface on the opposite side of the upper surface 18u of the dielectric window 18, that is, a lower surface 18b faces the processing space S. The lower surface 18b defines various shapes. Specifically, the lower surface 18b has a flat surface 180 in the central region surrounding the gas ejection port 18i. The flat surface 180 is a flat surface perpendicular to the Z axis. The lower surface 18b defines an annular first recess 181. The first recess 181 is annularly continuous in the region outside the flat surface 180 in the radial direction, and is recessed in a tapered shape from the lower side to the upper side.

Further, the lower surface 18b defines a plurality of second recesses 182. The plurality of second recesses 182 are recessed from the lower side to the upper side. The number of the plurality of second recesses 182 is seven in the example illustrated in FIGS. 3 and 4, but may be six or less, or eight or more. The plurality of second recesses 182 are equidistantly disposed along the circumferential direction. Further, the plurality of second recesses 182 have a circular planar shape in the surface perpendicular to the Z axis.

Figure 5:
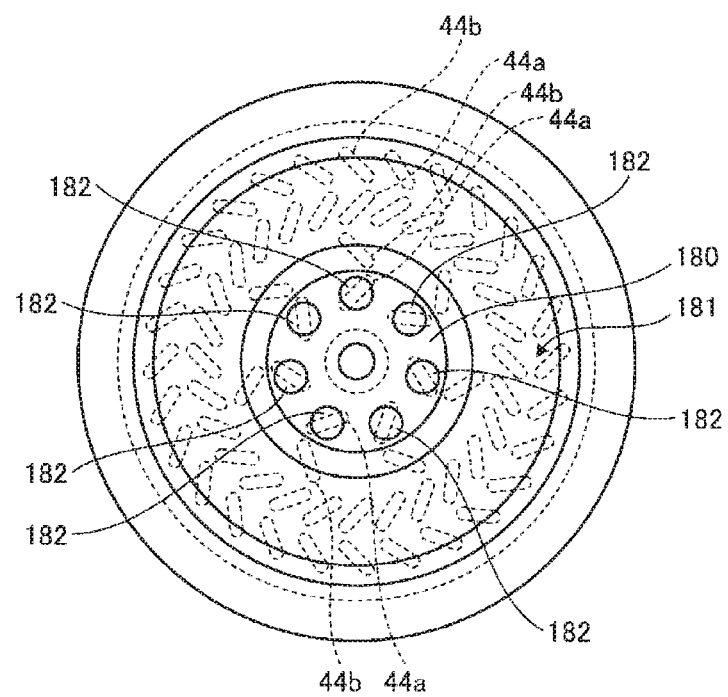
FIG. 5 is a plan view illustrating a state where the slot plate illustrated in FIG. 2 is provided on the dielectric window illustrated in FIG. 3.

FIG. 5 is a plan view illustrating a state where the slot plate 44 illustrated in FIG. 2 is provided on the dielectric window 18 illustrated in FIG. 3. FIG. 5 illustrates a state in which the dielectric window 18 is viewed from the lower side. For example, as illustrated in FIG. 5, in plan view, that is, when viewed in the Z axis direction, the slot pairs 44p provided in the slot plate 44 along the outer concentric circle in the radial direction are overlapped with the first recess 181 of the dielectric window 18. Further, the slot holes 44b of the slot pairs 44p formed in the slot plate 44 along the inner concentric circle in the radial direction are overlapped with the first recess 181 of the dielectric window 18. Further, the slot holes 44a of the slot pairs 44p formed along the inner concentric circle in the radial direction are overlapped with the plurality of second recesses 182.

FIG. 1 is referred to again. The microwave generated by the microwave generator 32 is propagated to the dielectric window 42 via the coaxial waveguide 16, and is propagated from the slot holes 44a and 44b in the slot plate 44 to the dielectric window 18. The energy of the microwave propagated to the dielectric window 18 is concentrated, immediately below the dielectric window 18, in the first recess 181 and the second recess 182 defined by the portion having a relatively thin plate thickness. Therefore, the etching apparatus 10 may generate a plasma so as to be stably distributed in the circumferential direction and the radial direction.

Further, the etching apparatus 10 includes the central introduction unit 50 and a peripheral introduction unit 52. The central introduction unit 50 includes a conduit 50a, an injector 50b, and the gas ejection port 18i. The conduit 50a is disposed inside the inner conductor 16b of the coaxial waveguide 16. Further, the end portion of the conduit 50a extends to the inside of the space 18s of the dielectric window 18 defined by along the Z axis. The injector 50b is accommodated in the space 18s below the end portion of the conduit 50a. The injector 50b includes a plurality of through-holes extending in the Z axis direction. Further, the dielectric window 18 includes the gas ejection port 18i described above. The gas ejection port 18i extends along the Z axis below the space 18s, and is communicated with the space 18s. The central introduction unit 50 supplies a gas to the injector 50b via the conduit 50a, and ejects the gas from the injector 50b into the processing space S via the gas ejection port 18i. As described above, the central introduction unit 50 ejects the gas into the processing space S immediately below the dielectric window 18 along the Z axis. That is, the central introduction unit 50 introduces the gas, in the processing space S, to the plasma generation region where the electron temperature is high. Further, the gas ejected from the central introduction unit 50 flows toward the central region of the wafer W along substantially the Z axis. The gas ejection port 18i is an example of a ceiling plate supply port.

The central introduction unit 50 is connected with a gas source group GSG1 via a flow rate control unit group FCG1. The gas source group GSG1 supplies a mixed gas containing a plurality of gases. The flow rate control unit group FCG1 includes a plurality of flow rate control devices and a plurality of opening/closing valves. The gas source group GSG1 is connected with the conduit 50a of the central introduction unit 50 via the flow rate control devices and the opening/closing valves in the flow rate control unit group FCG1.

For example, as illustrated in FIG. 1, the peripheral introduction unit 52 is provided between the gas ejection port 18i of the dielectric window 18 and the upper surface of the stage 20 in the height direction, that is, in the Z axis direction. The peripheral introduction unit 52 introduces a gas into the processing space S from a position along the side wall 12a. The peripheral introduction unit 52 includes a plurality of gas ejection ports 52i. The plurality of gas ejection ports 52i are arranged along the processing space S side of the side wall 12a, between the gas ejection port 18i of the dielectric window 18 and the upper surface of the stage 20 in the height direction.

The peripheral introduction unit 52 includes an annular pipe 52p, for example, made of quartz. The pipe 52p includes the plurality of gas ejection ports 52i. Each of the gas ejection ports 52i ejects a gas obliquely upward toward in the Z axis direction. The gas ejection port 52i is an example of a side wall supply port. For example, as illustrated in FIG. 1, the peripheral introduction unit 52 in the embodiment includes one pipe 52p. However, as another form, the peripheral introduction unit 52 may include two or more pipes 52p disposed in the vertical direction along the inside of the side wall 12a of the chamber 12. The pipe 52p of the peripheral introduction unit 52 is connected with a gas source group GSG2 via a gas supply block 56 and a flow rate control unit group FCG2. The flow rate control unit group FCG2 includes a plurality of flow rate control devices and a plurality of opening/closing valves. The gas source group GSG2 is connected with the peripheral introduction unit 52 via the flow rate control devices and the opening/closing valves in the flow rate control unit group FCG2. The flow rate control unit groups FCG1 and FCG2, and the gas source groups GSG1 and GSG2 are examples of a supply unit.

The etching apparatus 10 may independently control the type and the flow rate of the gas supplied from the central introduction unit 50 into the processing space S, and the type and the flow rate of the gas supplied from the peripheral introduction unit 52 into the processing space S. In the embodiment, the etching apparatus 10 supplies a same type of gas into the processing space S from the central introduction unit 50 and the peripheral introduction unit 52. Further, in the embodiment, the flow rate of the gas supplied from the central introduction unit 50 into the processing space S, and the flow rate of the gas supplied from the peripheral introduction unit 52 into the processing space S are set to the substantially same flow rate.

Further, for example, as illustrated in FIG. 1, the etching apparatus 10 includes a controller Cnt including, for example, a processor and a memory. The controller Cnt controls each part of the etching apparatus 10 according to data such as a recipe stored in the memory or a program.

For example, the controller Cnt controls each part of the etching apparatus 10 so as to perform an etching method described later. To explain using a more detailed example, the controller Cnt forms a second film on a workpiece including a processing target film, a layer including a plurality of convex portions formed on the processing target film, and a first film that covers the convex portions and the processing target film exposed between the convex portions. Then, the controller Cnt etches the second film in a state where the second film remains on a portion of the first film that covers the side surfaces of the convex portions, thereby exposing a portion of the first film covering the top of each of the convex portions and a portion covering the processing target film between the convex portions. Then, the controller Cnt etches the first film in a state where the second film remains on the portion of the first film that covers the side surfaces of the convex portions, thereby exposing the top of each of the convex portions and the processing target film between the convex portions. The workpiece is, for example, a wafer W. The detailed descriptions on the processing executed by the controller Cnt will be described later.

[Structure of Wafer W]

Figure 6:
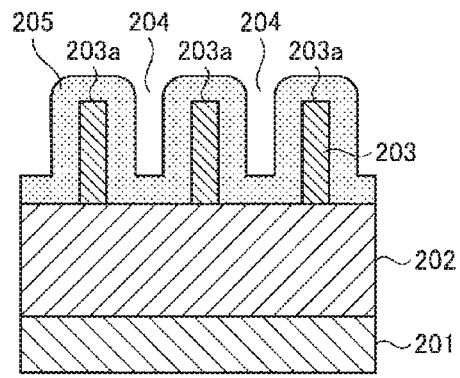
FIG. 6 is a cross-sectional view illustrating an example of a structure of a wafer in an embodiment.

FIG. 6 is a cross-sectional view illustrating an example of a structure of the wafer W in the embodiment. As illustrated in FIG. 6, the wafer W includes a processing target film 202 formed on a substrate 201, and a mandrel layer 203 including a plurality of convex portions 203a formed on the processing target film 202. Further, the wafer W includes a spacer film 205 that covers the convex portions 203a and the processing target film 202 exposed between the convex portions 203a.

The processing target film 202 is made of, for example, amorphous silicon, silicon oxide ($SiO_2$), or silicon nitride (SiN) film. The mandrel layer 203 is made of, for example, an organic film, amorphous silicon, silicon oxide ($SiO_2$), or silicon nitride (SiN). The mandrel layer 203 is formed to have the plurality of convex portions 203a serving as a mandrel (core material), and includes an opening 204 that exposes the processing target film 202 between the plurality of convex portions 203a. The mandrel layer 203 is an example of a layer including a plurality of convex portions.

The spacer film 205 is formed by, for example, chemical vapor deposition (CVD) or atomic layer deposition (ALD). The spacer film 205 is made of, for example, silicon oxide ($SiO_2$), silicon nitride (SiN), or carbon (C). When the spacer film 205 is formed, silicon oxide ($SiO_2$), silicon nitride (SiN), or carbon (C) that forms the spacer film 205 is conformally deposited. As a result, the spacer film 205 covers the convex portions 203a and the processing target film 202 exposed by the opening 204. The spacer film 205 is an example of the first film. The structure of the wafer W in FIG. 6 is the initial structure applied to the etching method described below.

[Etching Method]

Figure 7:
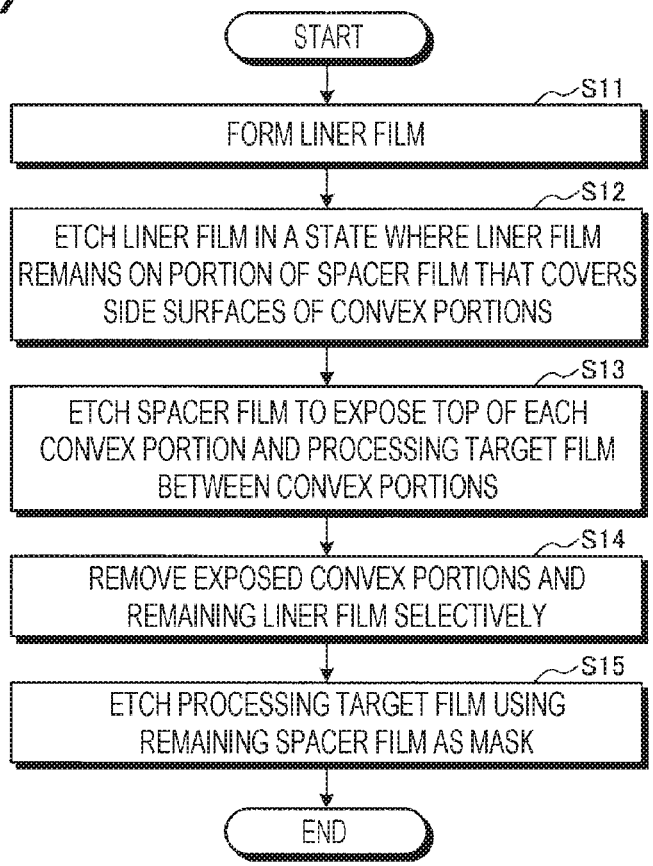
FIG. 7 is a flowchart illustrating an example of flow of processing of an etching method according to an embodiment.

FIG. 7 is a flowchart illustrating an example of flow of processing of an etching method according to an embodiment. FIGS. 8A to 8F are views for explaining an example of flow of processing of an etching method according to an embodiment.

As illustrated in FIG. 7, when the wafer W is carried into the chamber 12, the controller Cnt forms a liner film 206 on the wafer W (S11). The liner film 206 is formed by, for example, ALD. The liner film 206 is made of, for example, silicon oxide ($SiO_2$), silicon nitride (SiN), or carbon (C). When the liner film 206 is formed, silicon oxide ($SiO_2$), silicon nitride (SiN), or carbon (C) that forms the liner film 206 is conformally deposited. The liner film 206 is an example of the second film. Step S11 is an example of a film forming process.

Descriptions will be made on the film forming process of the liner film 206 by ALD in more detail. Here, the liner film 206 is assumed to be silicon oxide ($SiO_2$). First, the controller Cnt controls the vacuum pump of the exhaust device 30 to reduce the pressure inside the chamber 12. Subsequently, the controller Cnt controls the flow rate control device and the opening/closing valve in the flow rate control unit group FCG1 and FCG2 to supply a precursor gas into the chamber 12. As a result, the molecules of the precursor gas are adsorbed on the surface of the wafer W.

Examples of the precursor gas in the embodiment include a gas that contains a silicon element but does not contains an oxide element. Specifically, the precursor gas may be, for example, a gas containing an organic silicon compound or a gas containing an inorganic silicon compound.

The gas containing an organic silicon compound may be, for example, a monovalent to trivalent aminosilane-based gas. The monovalent to trivalent aminosilane-based gas may be, for example, one or more gases selected from bis (tertiary-butylamino)silane (BTBAS), bis(dimethylamino) silane (BDMAS), bis(diethylamino)silane (BDEAS), dimethylamino silane (DMAS), diethylamino silane (DEAS), dipropylamino silane (DPAS), butylamino silane (BAS), diisopropylamino silane (DIPAS), bis(ethylmethylamino) silane (BEMAS), and tris(dimethylamino)silane (TDMAS). Further, the gas containing an organic silicon compound may be, for example, a silicon alkoxide-based gas represented by tetraethoxysilane (TEOS).

The gas containing an inorganic silicon compound may be, for example, one or more type of gas selected from $SiCl_4$ gas, $SiF_4$ gas, $Si_2Cl_6$ gas, and $SiH_2Cl_2$ gas. For example, one or more type of gases selected from the group consisting of the gas containing an organic silicon compound and the gas containing an inorganic silicon compound may be used as the precursor gas.

Subsequently, the controller Cnt controls the flow rate control device and the opening/closing valve in the flow rate control unit group FCG1 and FCG2 to supply a purge gas onto the wafer W. As a result, for example, the molecules of the precursor gas excessively supplied onto the wafer W is removed by the purge gas.

Subsequently, the controller Cnt controls the flow rate control device and the opening/closing valve in the flow rate control unit group FCG1 and FCG2 to supply a reaction gas containing constituent elements of the liner film 206 into the chamber 12.

For example, a gas containing an oxide element but not a silicon element is used as the reaction gas in the embodiment. Specifically, for example, one or more type of gases selected from $O_2$ gas, CO gas, $CO_2$ gas, $O_3$ gas, or $H_2O$ gas are used as the reaction gas.

Subsequently, the controller Cnt controls the microwave generator 32 to supply the microwave into the chamber 12. As a result, a plasma of the reaction gas is generated, and for example, oxygen radicals (O*) are generated as an active species. Then, the generated active species reacts with the molecules of the precursor gas adsorbed on the wafer W to form a silicon oxide film.

When the liner film 206 is made of silicon nitride (SiN), for example, a gas containing a nitrogen element but not a silicon element is used as the reaction gas. Specifically, for example, one or more type of gases selected from NO gas, $N_2O$ gas, $N_2$ gas, or $NH_3$ gas are used as the reaction gas. In this case, nitride radicals (N*) generated as an active species by a plasma react with the molecules of the precursor gas adsorbed on the wafer W to form a silicon oxide film.

Subsequently, the controller Cnt controls the flow rate control device and the opening/closing valve in the flow rate control unit group FCG1 and FCG2 to supply a purge gas onto the wafer W. As a result, for example, the active species excessively supplied onto the wafer W or reaction byproducts are removed by the purge gas.

Figure 8A:
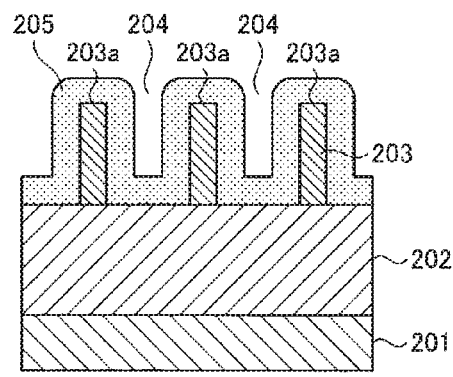
Figure 8B:
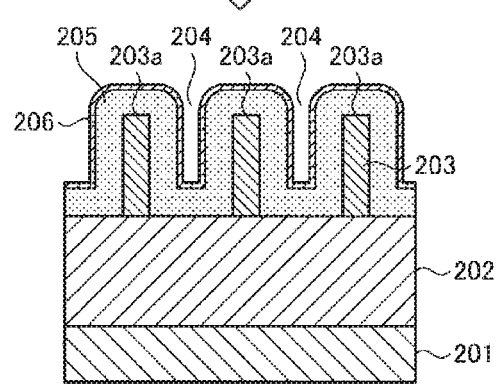

The controller Cnt sets the adsorption of the molecules of the precursor gas, the supply of the purge gas, the generation of the active species of the reaction gas, and the supply of the purge gas as one cycle, and repeats the cycle a plurality of times. As a result, as illustrated in FIG. 8B, for example, the liner film 206 made of silicon oxide ($SiO_2$) is formed on the spacer film 205. FIG. 8A corresponds to the wafer W in FIG. 6.

Figure 8C:
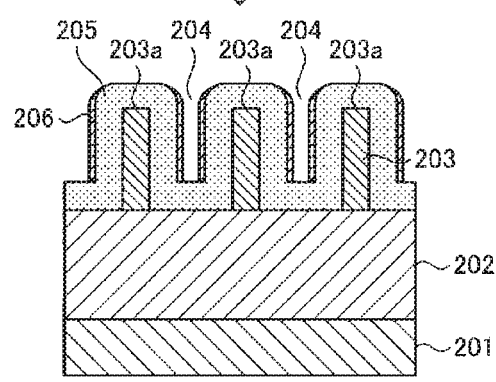

The description will refer back to FIG. 7. The controller Cnt etches the liner film 206 in a state where the liner film 206 remains on the portion of the spacer film 205 that covers the side surface of each convex portion 203a (S12). As a result, as illustrated in FIG. 8C, the portion of the spacer film 205 that covers the top of each convex portion 203 and the portion of the spacer film 205 that covers the processing target film 202 between the convex portions 203a are exposed. Here, the liner film 206 is etched by a plasma of a first processing gas that differs depending on the combination of the film types of the liner film 206 and the spacer film 205. For example, when the liner film 206 is made of silicon oxide ($SiO_2$), and the spacer film 205 is made of silicon nitride (SiN) or carbon (C), the first processing gas is $Ar/CF_4$. Further, for example, when the liner film 206 is made of silicon nitride (SiN), and the spacer film 205 is made of silicon oxide ($SiO_2$) or carbon (C), the first processing gas is $Ar/CF_4$. Further, for example, when the liner film 206 is made of carbon (C), and the spacer film 205 is made of silicon oxide ($SiO_2$) or silicon nitride (SiN), the first processing gas is $N_2/H_2$. Step S12 is an example of a first etching process.

The first etching process will be described with a more detailed example. The controller Cnt controls the flow rate control device and the opening/closing valve in the flow rate control unit group FCG1 and FCG2 to introduce the first processing gas into the chamber 12, and controls the microwave generator 32 to supply the microwave into the chamber 12. As a result, the plasma of the first processing gas is generated and the liner film 206 is etched by the plasma of the first processing gas. As a result, the liner film 206 positioned on each convex portion 203a is removed, and the portion of the spacer film 205 that covers the top of each convex portion 203a is exposed. Further, the liner film 206 on the bottom surface side of the opening 204 is removed, and the portion of the spacer film 205 that is positioned on the bottom surface side of the opening 204 is exposed.

Then, the controller Cnt etches the spacer film 205 in a state where the liner film 206 remains on the portion of the spacer film 205 that covers the side surface of each convex portion 203a (S13), thereby exposing the top of each convex portion 203a and the processing target film 202 between the convex portion 203a. As a result, as illustrated in FIG. 8D, the top of each convex portion 203a is exposed, and the portion of the processing target film 202 that is positioned at the opening 204, and the portion of the spacer film 205 that covers the side surface of each convex portion 203a are converted to a pair of convex portions 205a and 205b. Here, the spacer film 205 is etched by a plasma of a second processing gas that differs depending on the combination of the film types of the spacer film 205 and the liner film 206. For example, when the spacer film 205 is made of silicon oxide ($SiO_2$), and the liner film 206 is made of silicon nitride (SiN) or carbon (C), the second processing gas is $Ar/C_4F_6$. Further, for example, when the spacer film 205 is made of silicon nitride (SiN), and the liner film 206 is made of silicon oxide ($SiO_2$), the second processing gas is $Ar/CH_3F/O_2$. Further, for example, when the spacer film 205 is made of carbon (C), and the liner film 206 is made of silicon oxide ($SiO_2$) or silicon nitride (SiN), the second processing gas is $N_2/H_2$. Step S13 is an example of a second etching process.

The second etching process will be described with a more detailed example. The controller Cnt controls the flow rate control device and the opening/closing valve in the flow rate control unit group FCG1 and FCG2 to introduce the second processing gas into the chamber 12, and controls the microwave generator 32 to supply the microwave into the chamber 12. As a result, the plasma of the second processing gas is generated and the spacer film 205 is etched by the plasma of the second processing gas. As a result, the portion of the spacer film 205 that covers the top of each convex portion 203a is removed so that the top of each convex portion 203a is exposed, and the spacer film 205 between the convex portions 203a is removed so that the processing target film 202 in the opening 204 is exposed. Further, the portion of the spacer film 205 that covers the side surface of each convex portion 203a is converted to the pair of convex portions 205a and 205b sandwiching each convex portion 203a.

Figure 9A:
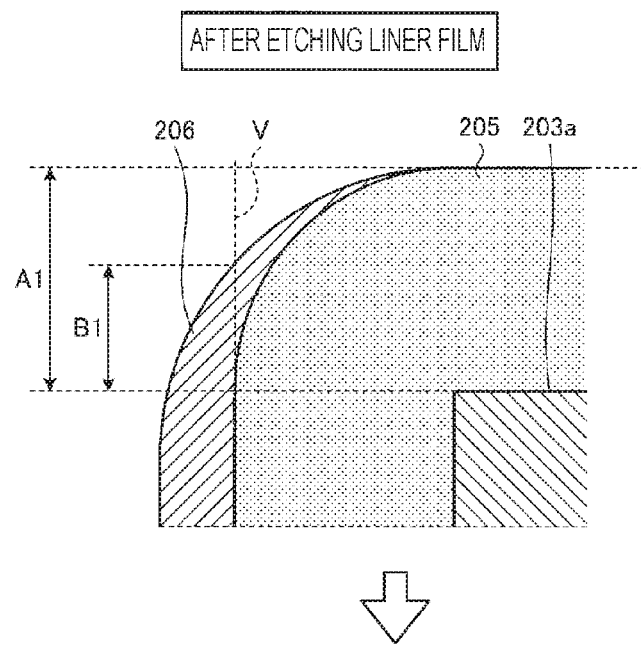
FIGS. 9A and 9B are views for further explaining a second etching process in an embodiment.
Figure 9B:
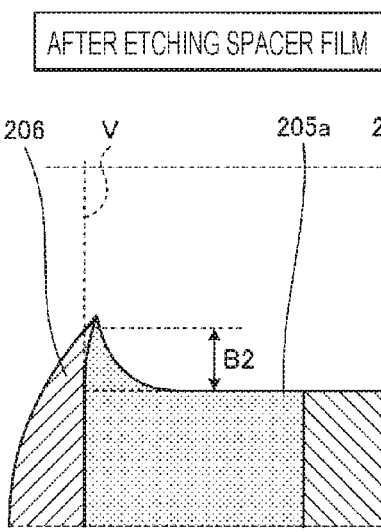

FIGS. 9A and 9B are views for further explaining the second etching process in the embodiment. FIG. 9A is a cross-sectional view of the wafer W after the first etching process, that is, after the liner film 206 is etched (S12). FIG. 9B is a cross-sectional view of the wafer W after the second etching process, that is, after the spacer film 205 is etched (S13).

As illustrated in FIG. 9B, when the second etching process is performed, for the purpose of protecting the shoulder of the pair of convex portions 205a and 205b converted from the portion of the spacer film 205 that covers the side surface of each convex portion 203a from the plasma by the remaining liner film 206, the controller Cnt etches the spacer film 205 so that the height of the liner film 206 remaining on the portion of the spacer film 205 that covers the side surface of each convex portion 203a is equal to or higher than the height of each convex portion 203a. As a result, the degree of the roundness of the shoulder of the pair of convex portions 205a and 205b is reduced, and it is possible to increase the thickness of the shoulder of the pair of convex portions 205a and 205b in the height direction. As a result, the cross-sectional shape of the pair of convex portions 205a and 205b is symmetrical, and has a rectangular shape substantially vertical with respect to the processing target film 202. As a result, the pair of convex portions 205a and 205b function as a mask having a sufficient thickness in the vertical direction.

From the viewpoint of protecting the shoulder of the pair of convex portions 205a and 205b, in the second etching process, a selection ratio of the spacer film 205 to the liner film 206 may be A1/B1 or more. Here, A1 is the film thickness of the portion of the spacer film 205 that covers the top of each convex portion 203a after the liner film 206 is etched. Further, B1 is the film thickness of the liner film 206 remaining on the portion of the spacer film 205 that covers the side surface of each convex portion 203a after the liner film 206 is etched, in a virtual plane V along the portion of the spacer film 205. That is, when it is assumed that, on the virtual plane V, the film thickness of the liner film 206 remaining on the pair of convex portions 205a and 205b after the spacer film 205 is etched is B2, the selection ratio of the spacer film 205 to the liner film 206 is indicated by A1/(B1−B2). Here, when B2≤0 is established, it is considered that the shoulder of the pair of convex portions 205a and 205b are protected by the liner film 206. Therefore, in the second etching process, the selection ratio of the spacer film 205 to the liner film 206 may be A1/B1 or more.

The description will refer back to FIG. 7. The controller Cnt selectively removes each convex portion 203a exposed after the spacer film 205 is etched, and the remaining liner film 206 (S14). As a result, as illustrated in FIG. 8E, each exposed convex portion 203a is selectively removed to form a space 207 between the pair of convex portions 205a and 205b. Here, each exposed convex portion 203a and the remaining liner film 206 are removed by, for example, a plasma of a third processing gas. Step S14 is an example of a removing process.

For example, in the removing process, the controller Cnt controls the flow rate control device and the opening/closing valve in the flow rate control unit group FCG1 and FCG2 to introduce the third processing gas into the chamber 12, and controls the microwave generator 32 to supply the microwave into the chamber 12. As a result, the plasma of the third processing gas is generated, and each exposed convex portion 203a and the remaining liner film 206 are removed.

Then, the controller Cnt etches the processing target film 202 using the remaining spacer film 205 as a mask (S15). As a result, as illustrated in FIG. 8F, the processing target film 202 is etched using the plurality of convex portions 205a and 205b as masks. Here, the processing target film 202 is etched by, for example, a plasma of a fourth processing gas. Step S15 is an example of a third etching process.

In the third etching process, the controller Cnt controls the flow rate control device and the opening/closing valve in the flow rate control unit group FCG1 and FCG2 to introduce the fourth processing gas into the chamber 12, and controls the microwave generator 32 to supply the microwave into the chamber 12. As a result, the plasma of the fourth processing gas is generated, and the processing target film 202 that is not covered with the plurality of convex portions 205a and 205b is etched. As a result, an opening 208 corresponding to the opening 204 is formed in the processing target film 202, and an opening 209 corresponding to the space 207 between the pair of convex portions 205a and 205b is formed. Further, since the cross-sectional shape of the pair of convex portions 205a and 205b is symmetrical, and has a rectangular shape substantially vertical with respect to the processing target film 202, the ions entering the opening 204 and the ions entering the space 207 between the pair of convex portions 205a and 205b have substantially the same amount of ions, and collide with the processing target film 202 substantially vertically. As a result, when the opening 208 and the opening 209 are compared, distortion of the cross-sectional shape is suppressed, and variation in width and depth is suppressed, and thus, a uniform etching shape is obtained.

As described above, the etching method according to the embodiment includes the film forming process, the first etching process, and the second etching process. In the film forming process, the liner film 206 is formed on a workpiece including the processing target film 202, the layer including the plurality of convex portions 203 formed on the processing target film 202, and the spacer film 205 covering the processing target film exposed between the plurality of convex portions 203a and each of the convex portions 203a. In the first etching process, the liner film 206 is etched in a state where the liner film 206 remains on the portion of the spacer film 205 that covers the side surface of each convex portion 203a. In the second etching process, the top of each convex portion 203a and the processing target film 202 between the convex portions 203a are exposed by etching the spacer film 205 in a state where the liner film 206 remains on the portion of the spacer film 205 that covers the side surface of each convex portion 203a. As a result, the shoulder of the pair of convex portions 205a and 205b converted from the portion of the spacer film 205 that covers the side surface of each convex portion 203a is protected from a plasma by the remaining liner film 206. As a result, as compared with a method in which the film forming process is not performed, it is possible to reduce the degree of the roundness of the shoulder of the pair of convex portions 205a and 205b. In other words, it is possible to improve the shape of the shoulder of the spacer film 205 as a mask, and secure a sufficient mask thickness in the vertical direction with respect to the processing target film 202. As a result, it is possible to enhance the function as a mask in the subsequent etching, and obtain a uniform etching shape.

That is, when performing the SAMP, the shoulder of the mask is etched and rounded, so that the thickness as a mask may not be secured sufficiently. Meanwhile, according to the embodiment, after the liner film 206 is formed, the first etching and the second etching is performed in a state where the liner film 206 remains on the portion of the spacer film 205 that covers the side surface of each convex portion 203a, and thus, the shape of the shoulder may be improved.

The spacer film 205 remaining after the removing process in step S14, that is, the plurality of convex portions 205a and 205b serve as a mask for etching of the processing target film 202 in the third etching process in step S15. In the embodiment, the respective convex portions 205a and the convex portions 205b have the same size, and the space 207 between the convex portions 205a and 205b and the opening 204 have the same size, and thus, it is possible to obtain a more uniform etching shape. For that purpose, in the second etching process in step S13, it is desirable to expose the portion of the processing target film 202 positioned at the opening 204, as well as further perform etching on the portion, so that a part of the spacer film 205 positioned immediately below the liner film 206 remaining on the portion that covers the side surface of each convex portion 203a in FIG. 8C is excessively etched by an amount of the thickness of the liner film 206 in the horizontal direction with respect to the processing target film 202, as illustrated in FIG. 8D.

Other Embodiments

In the above, descriptions have been made on the etching method and the etching apparatus according to the embodiment. However, the disclosed technology is not limited thereto. Hereinafter, other embodiments will be described.

For example, in the embodiment, each convex portion 203a exposed after the spacer film 205 is etched, and the remaining liner film 206 are selectively removed, and then, the processing target film 202 is etched using the remaining spacer film 205 as a mask, but the disclosed technology is not limited thereto. For example, the processing target film 202 may be etched using each convex portion 203a exposed after the spacer film 205 is etched, and the remaining spacer film 205 and the liner film 206 as masks. As a result, it is possible to use a mask with the opening 204 having a finer size than the space size between each of the convex portions 203a when the processing target film is etched using each convex portion 203a as a mask. Hereinafter, descriptions will be made an example in which the processing target film 202 is etched using each convex portion 203a exposed after the spacer film 205 is etched, and the remaining spacer film 205 and the liner film 206 as masks, with reference to FIGS. 10, 11A to 11E.

Figure 10:
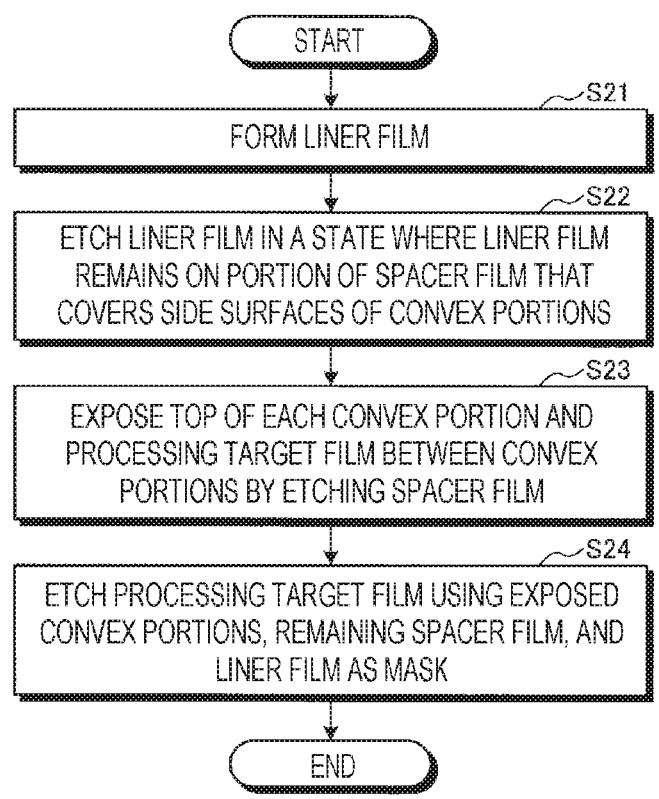
FIG. 10 is a flowchart illustrating an example of flow of processing of an etching method according to another embodiment.

FIG. 10 is a flowchart illustrating an example of flow of processing of an etching method according to another embodiment. FIGS. 11A to 11E are views for explaining an example of flow of processing of the etching method according to another embodiment. Steps S21 to S23 in FIG. 10 correspond to steps S11 to S13 in FIG. 7. Further, FIGS. 11A to 11C correspond to FIGS. 8A to 8C. Further, FIG. 11D corresponds to FIG. 8D.

Figure 11A:
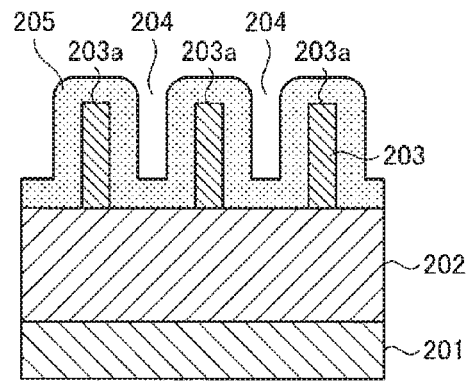
FIGS. 11A to 11E are views for explaining an example of flow of processing of an etching method according to another embodiment.
Figure 11B:
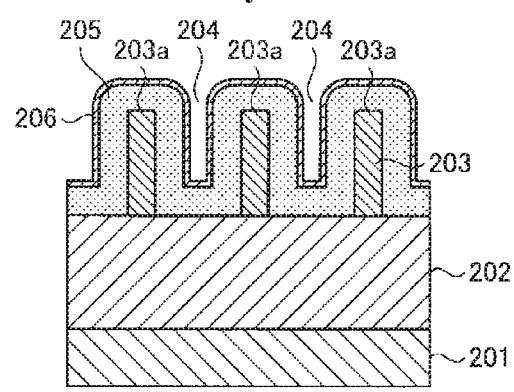
Figure 11C:
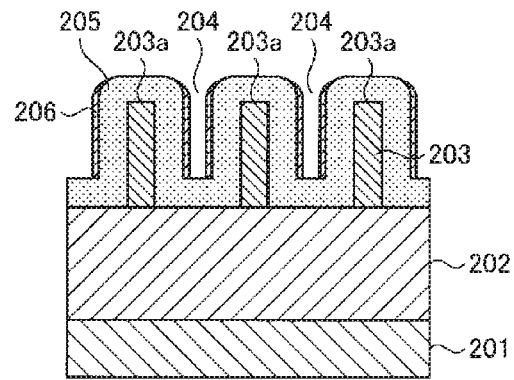
Figure 11D:
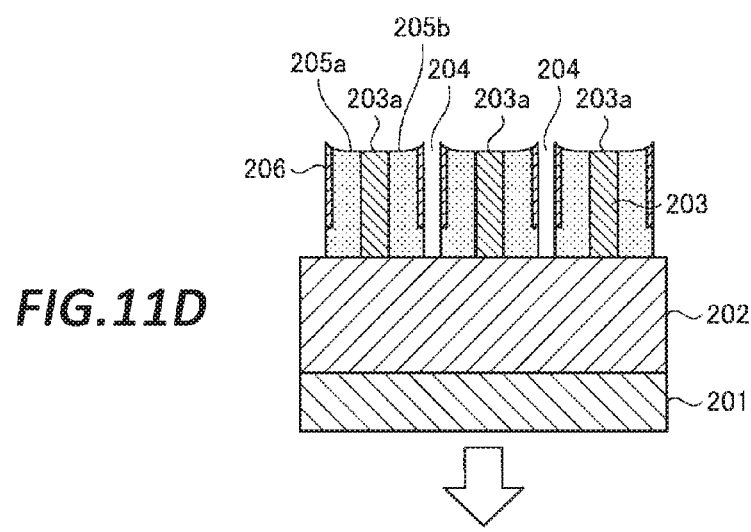
Figure 11E:
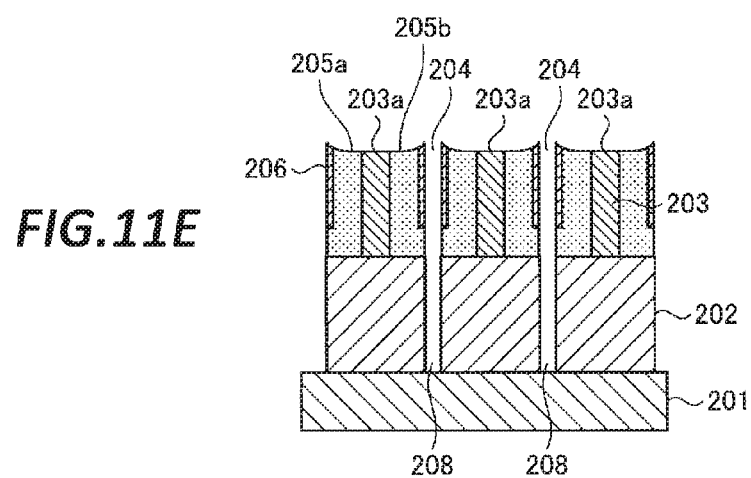

As illustrated in FIG. 10, the controller Cnt etches the processing target film 202 using each convex portion 203a exposed after the spacer film 205 is etched, and the remaining spacer film 205 and the liner film 206 as masks (S24). As a result, as illustrated in FIG. 11E, the processing target film 202 is etched using each convex portion 203a, the pair of convex portions 205a and 205b sandwiching each convex portion 203a, the liner film 206 remaining on the pair of convex portions 205a and 205b as one mask pattern. Here, the processing target film 202 is etched by, for example, a plasma of a fifth processing gas. Step S24 is an example of a fourth etching process.

In the fourth etching process, the controller Cnt controls the flow rate control device and the opening/closing valve in the flow rate control unit group FCG1 and FCG2 to introduce the fifth processing gas into the chamber 12, and controls the microwave generator 32 to supply the microwave into the chamber 12. As a result, the plasma of the fifth processing gas is generated, and the processing target film 202 that is not covered with the mask including a plurality of mask patterns described above is etched. As a result, the opening 208 corresponding to the opening 204 is formed in the processing target film 202. Further, since the degree of the roundness of the shoulder of the pair of convex portions 205a and 205b is reduced, the cross-sectional shape of the pair of convex portions 205a and 205b is a rectangular shape substantially vertical with respect to the processing target film 202, and the pair of convex portions 205a and 205b have a sufficient thickness in the vertical direction with respect to the processing target film 202. When the space size of the mask becomes fine, the etching rate decreases due to the microloading effect, and the selectivity of the mask also tends to deteriorate. However, since the mask has a sufficient thickness in the vertical direction, although subsequent etching is performed on the processing target film 202, the etching may be performed without impairing the selectivity of the mask.

Further, in the embodiment, an example of the spacer film 205 or the liner film 206 is described using silicon oxide ($SiO_2$), silicon nitride (SiN), or carbon (C), but the disclosed technology is not limited thereto. For example, the spacer film 205 or the liner film 206 may be made of silicon carbide (SiC), or a film having an intermediate composition or property such as silicon oxynitride (SiON) or silicon carbonitride (SiCN).

Further, in the embodiment, the microwave plasma processing apparatus using RLSA is described as an example of the etching apparatus 10, the disclosed technology is not limited thereto. The present disclosure may also be applied to a plasma processing apparatus using another method such as, for example, capacitively coupled plasma (CCP) or inductively coupled plasma (ICP) as long as the apparatus performs a processing using a plasma.

Further, in the embodiment, an example in which the film forming process, the first etching process, the second etching process, the removing process, and the third etching process are continuously performed in one chamber 12 in one etching apparatus 10 while maintaining a vacuum state, but the disclosed technology is not limited thereto. For example, the processes may be performed continuously using a plurality of chambers connected via a transfer system kept under vacuum.

Further, in the embodiment, a process of forming the spacer film 205 on the convex portions in one chamber 12 before forming the liner film 206 on the spacer film 205 may be included, and also, a process of etching the convex portions using a mask before the process of forming the spacer film 205 on the convex portions may be included.

DESCRIPTION OF SYMBOLS

10: etching apparatus
12: chamber
20: stage
30: exhaust device
32: microwave generator
201: substrate
202: processing target film
203: mandrel layer
203A: convex portion
205: spacer film
206: liner film
FCG1 and FCG2: flow rate control unit group
GSG1 and GSG2: gas source group

What is claimed is:

1. An etching method comprising:
forming, using a precursor gas and a reaction gas, a second film on a workpiece, the workpiece including a processing target film, a layer including a plurality of convex portions formed on the processing target film, and a first film that covers the plurality of convex portions, wherein the first film also covers the processing target film between the plurality of convex portions, wherein the precursor gas is a gas containing an organic silicon compound or a gas containing an inorganic silicon compound;
etching the second film with a first processing gas such that, after the etching of the second film: (i) the second film remains on a first portion of the first film that covers a side surface of each of the plurality of convex portions, (ii) a second portion of the first film that covers a top of each of the plurality of convex portions is exposed, and (iii) a third portion of the first film that covers the processing target film extending between the plurality of convex portions is exposed; and
after etching the second film with the first processing gas, etching the first film with a second processing gas different from the first processing gas, and wherein at a start of the etching of the first film with the second processing gas each of (i), (ii) and (iii) is present, the etching of the first film exposing: (a) at least part of the top portion of each of the plurality of convex portions, and (b) at least part of the processing target film between the plurality of convex portions.

2. The etching method according to claim 1, wherein, in the etching the first film, the first film is etched such that a height of the second film remaining on the first portion of the first film that covers the side surface of each of the plurality of convex portions is equal to or higher than a height of each of the plurality of convex portions.

3. The etching method according to claim 1, wherein, in the etching the first film, a selection ratio of the first film to the second film is A1/B1 or more, provided that A1 represents a film thickness of the second portion of the first film that covers the top portion of each of the plurality of convex portions after the etching the second film, and B1 represents a film thickness of the second film remaining on the first portion of the first film that covers the side surface of each of the plurality of convex portions after the etching the second film with B1 a thickness above the top portion of each of the plurality of convex portions, in a virtual plane along the first portion of the first film.

4. The etching method according to claim 1, further comprising:
selectively removing: (i) the plurality of convex portions exposed after the etching the first film, and (ii) the second film remaining after the etching the first film; and
after the selectively removing, etching the processing target film using the first film remaining after the etching the first film, as a mask.

5. The etching method according to claim 1, further comprising, after the etching of the first film:
etching the processing target film using as masks each of: (i) the plurality of convex portions exposed after the etching the first film, (ii) the first film remaining after the etching the first film, and (iii) the second film remaining after the etching the first film.

6. An etching apparatus comprising:
a chamber configured to receive a workpiece;
an exhaust configured to reduce a pressure inside the chamber;
a gas supply configured to supply a processing gas into the chamber; and
a controller configured to control an overall operation of the etching apparatus executing a process including:
forming, using a precursor gas and a reaction gas, a second film on a workpiece, the workpiece including (a) a processing target film, (b) a layer including a plurality of convex portions formed on the processing target film, and (c) a first film that covers the plurality of convex portions and the processing target film exposed between the plurality of convex portions, the precursor gas containing an organic silicon compound or a gas containing an inorganic silicon compound;
etching the second film with a first processing gas such that, after the etching of the second film: (i) the second film remains on a first portion of the first film that covers a side surface of each of the plurality of convex portions, (ii) a second portion of the first film that covers a top of each of the plurality of convex portions is exposed, and (iii) a third portion of the first film that covers the processing target film extending between the plurality of convex portions is exposed; and
after etching the second film with the first processing gas, etching the first film with a second processing gas different from the first processing gas, and wherein at a start of the etching of the first film with the second processing gas each of (i), (ii) and (iii) is present, the etching of the first film exposing: (a) at least part of the top portion of each of the plurality of convex portions, and (b) at least part of the processing target film between the plurality of convex portions.

7. The etching method according to claim 1, wherein in the etching the first film, a fourth portion of the first film is etched at a location positioned immediately below the second film remaining on the first portion of the first film and above the processing target film, wherein the fourth portion is etched by an amount of a thickness of the second film in a horizontal direction with respect to the processing target film.

8. The etching method according to claim 1, wherein the second film is made of silicon oxide ($SiO_2$), silicon nitride (SiN), or carbon (C).

9. The etching method according to claim 1, wherein the precursor gas contains the organic silicon compound, and the organic silicon compound comprises a material selected from a group consisting of bis(tertiary-butylamino)silane (BTBAS), bis(dimethylamino)silane (BDMAS), bis(diethylamino)silane (BDEAS), dimethylamino silane (DMAS), diethylamino silane (DEAS), dipropylamino silane (DPAS), butylamino silane (BAS), diisopropylamino silane (DIPAS), bis(ethylmethylamino)silane (BEMAS), tris(dimethylamino)silane (TDMAS), and tetraethoxysilane (TEOS).

10. The etching method according to claim 1, wherein the precursor gas contains the inorganic silicon compound, and the inorganic silicon compound comprises a material selected from a group consisting of $SiCl_4$, $SiF_4$, $Si_2Cl_6$, and $SiH_2Cl_2$.

11. The etching method according to claim 1, wherein the reaction gas comprises a gas selected from a group consisting of $O_2$ gas, CO gas, $CO_2$ gas, $O_3$ gas), or $H_2O$ gas.

12. The etching method according to claim 1, wherein the reaction gas comprises a gas selected from a group consisting of NO gas, $N_2O$ gas, $N_2$ gas, or $NH_3$ gas.

13. An etching method comprising:
forming a second film on a workpiece, the workpiece including a processing target film, a layer including a plurality of convex portions formed on the processing target film, and a first film that covers the plurality of convex portions, wherein the first film also covers the processing target film between the plurality of convex portions;
etching the second film with a first processing gas such that, after the etching of the second film: (i) the second film remains on a first portion of the first film that covers a side surface of each of the plurality of convex portions, (ii) a second portion of the first film that covers a top of each of the plurality of convex portions is exposed, (iii) a third portion of the first film that covers the processing target film extending between the plurality of convex portions is exposed; and
after etching the second film with the first processing gas, etching the first film with a second processing gas different from the first processing gas, and wherein at a start of the etching of the first film with the second processing gas each of (i), (ii) and (iii) is present, the etching of the first film exposing: (a) at least part of the top portion of each of the plurality of convex portions, and (b) at least part of the processing target film between the plurality of convex portions,
wherein prior to forming the second film, the first film has first and second shoulders for each convex portion,
wherein after forming the second film and before etching the second film, the second film covers the first and second shoulders of the first film and top portions of the first film between the first and second shoulders,
wherein after the etching of the second film and before the etching of the first film, at least part of the top portions of the first film between the first and second shoulders is exposed and covers the top of each convex portion, and
wherein after the etching of the second film and before the etching of the first film, the second film which remains extends over tops of the first and second shoulders.

14. The method of claim 13, wherein after the etching of the first film, first and second portions of the first film remain on first and second sides of each convex portion and the first and second portions of the first film are symmetrical with respect to each other.

* * * * *